United States Patent
Ge

(10) Patent No.: US 11,849,654 B2
(45) Date of Patent: Dec. 19, 2023

(54) PROTON-BASED TWO-TERMINAL VOLATILE MEMRISTIVE DEVICES

(71) Applicant: TETRAMEM INC., Newark, CA (US)

(72) Inventor: Ning Ge, Newark, CA (US)

(73) Assignee: TETRAMEM INC., Fremont, CA (US)

( * ) Notice: Subject to any disclaimer, the term of this patent is extended or adjusted under 35 U.S.C. 154(b) by 142 days.

(21) Appl. No.: 17/648,494

(22) Filed: Jan. 20, 2022

(65) Prior Publication Data

US 2022/0216399 A1 Jul. 7, 2022

Related U.S. Application Data

(62) Division of application No. 16/797,865, filed on Feb. 21, 2020, now Pat. No. 11,322,683.

(51) Int. Cl.
| | |
|---|---|
| *G06N 3/04* | (2023.01) |
| *H10N 70/00* | (2023.01) |
| *H10N 70/20* | (2023.01) |
| *H01L 49/02* | (2006.01) |
| *G06N 3/063* | (2023.01) |
| *G11C 11/54* | (2006.01) |
| *H10B 63/00* | (2023.01) |

(52) U.S. Cl.
CPC ............ *H10N 70/245* (2023.02); *G06N 3/04* (2013.01); *G06N 3/063* (2013.01); *G11C 11/54* (2013.01); *H01L 28/60* (2013.01); *H10B 63/80* (2023.02); *H10N 70/826* (2023.02); *H10N 70/8416* (2023.02); *H10N 70/8833* (2023.02)

(58) Field of Classification Search
CPC ............... H10N 70/245; H10N 70/826; H10N 70/8416; H10N 70/8833; H01L 28/60; H10B 63/80; G06N 3/049
See application file for complete search history.

(56) References Cited

U.S. PATENT DOCUMENTS

| | | | |
|---|---|---|---|
| 2011/0266510 A1* | 11/2011 | Quitoriano | H10N 70/043 257/776 |
| 2012/0091427 A1 | 4/2012 | Chen et al. | |
| 2012/0295398 A1* | 11/2012 | Kurunczi | H10N 70/043 257/E47.005 |
| 2021/0265564 A1 | 8/2021 | Ge | |

OTHER PUBLICATIONS

U.S. Appl. No. 16/797,865, "Notice of Allowance" dated Jan. 3, 2022, 11 pages.

* cited by examiner

*Primary Examiner* — Shih Tsun A Chou
(74) *Attorney, Agent, or Firm* — Jaffery Watson Mendonsa & Hamilton LLP

(57) ABSTRACT

Technologies relating to crossbar array circuits with proton-based two-terminal volatile memristive devices are disclosed. An example apparatus includes a first bottom conductive layer, a capacitor oxide layer formed on the first bottom conductive layer, a second bottom conductive layer formed on the capacitor oxide layer, a second oxide layer formed on the second bottom conductive layer, and a proton reservoir layer formed on the second oxide layer. In some embodiments, the second bottom conductive layer is H-doped. In some embodiments, a conductance of the second oxide layer is modulated by H-dopant.

15 Claims, 17 Drawing Sheets

PROTON-BASED TWO-TERMINAL VOLATILE MEMRISTIVE DEVICES

CROSS REFERENCE TO RELATED APPLICATIONS

This application is a division of U.S. patent application Ser. No. 16/797,865, filed Feb. 21, 2020, which is hereby incorporated by reference herein in its entirety.

TECHNICAL FIELD

The present disclosure generally relates to crossbar array circuits and more specifically to crossbar array circuits with a proton-based two-terminal volatile memristor or memcapacitor device.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

An RRAM is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process.

The existence of sneak current within resistive memories, especially in a large-scale crossbar array circuit, remains a technical challenge. Sneak current may trigger unwanted actions (e.g., unintended programming) and may prevent desirable actions (e.g., read errors). This is undesirable such applications as in-memory computing applications and neuromorphic computing applications. For instance, during a neuromorphic computing process, when synaptic weights are being adapted based on discrete conductance states of an RRAM, a slight conductance change of the RRAM may adversely impact computation results.

SUMMARY

Technologies relating to crossbar array circuits with proton-based two-terminal volatile memristive devices are disclosed.

In accordance with some implementations, an apparatus may include a first bottom conductive layer, a capacitor oxide layer formed on the first bottom conductive layer, a second bottom conductive layer formed on the capacitor oxide layer, a second oxide layer formed on the second bottom conductive layer, and a proton reservoir layer formed on the second oxide layer. In some embodiments, the second bottom conductive layer is H-doped, and a conductance of the second oxide layer is modulated by H-dopant.

In some embodiments, the first bottom conductive layer may include at least one of Pd, Pt, Ir, W, Ta, Hf, Nb, V, Ti, TiN, TaN, or NbN.

In some embodiments, the first bottom conductive layer may include an alloy comprising at least one of Pd, Pt, Ir, W, Ta, Hf, Nb, V, Ti, TiN, TaN, or NbN.

In some embodiments, the capacitor oxide layer may include at least one of $TaO_2$, $HfO_2$, or $TiO_2$.

In some embodiments, the second bottom conductive layer may include at least one of TiN, Pt, TaN, Al, or Ni.

In some embodiments, the second bottom conductive layer may include an alloy comprising at least one of TiN, Pt, TaN, Al, or Ni.

In some embodiments, the second oxide layer comprises at least one of $WO_3$, $TiO_2$, $VO_2$, $Nb_2O_5$, $Ta_2O_5$, or $HfO_2$.

In some embodiments, the proton reservoir layer comprises at least one of $Cr_2O_3$ or $PdH_4$.

In some embodiments, a dielectric constant of the capacitor oxide layer is not less than 10.

In accordance with some implementations, the apparatus may further include a first top conductive layer formed between the capacitor oxide layer and the second bottom conductive layer.

In some embodiments, the first top conductive layer may include at least one of Pd, Pt, Ir, W, Ta, Hf, Nb, V, Ti, TiN, TaN, or NbN.

In some embodiments, the first top conductive layer may include an alloy comprising at least one of Pd, Pt, Ir, W, Ta, Hf, Nb, V, Ti, TiN, TaN, or NbN.

In accordance with some implementations, the apparatus may further include an intermediate layer formed between the first top conductive layer and the second bottom conductive layer.

In some embodiments, the intermediate layer may include at least one of W, Al, Cu, Pt, Ir, Ru, Pd, Au, TiN, TaN, WN, $RuO_2$, or $IrO_2$.

In some embodiments, the intermediate layer may include an alloy comprising at least one of W, Al, Cu, Pt, Ir, Ru, Pd, Au, TiN, TaN, WN, $RuO_2$, or $IrO_2$.

DETAILED DESCRIPTION

Figures 1A, 1B:
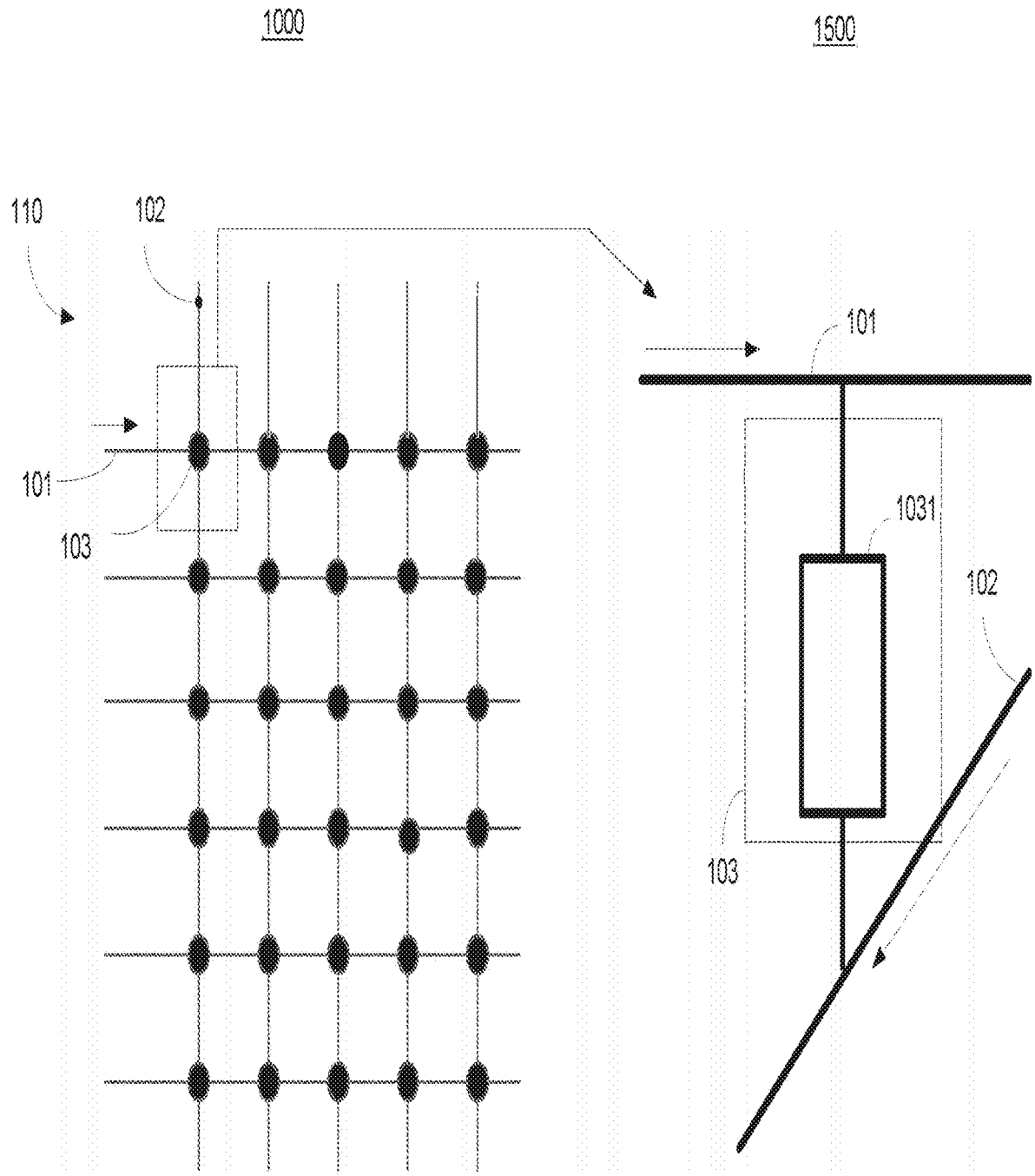
FIG. 1A is a block diagram illustrating an example crossbar array circuit in accordance with some implementations of the present disclosure.
FIG. 1B is a block diagram illustrating a partially enlarged view of an example cross-point device in accordance with some implementations.

Technologies relating to crossbar array circuits with proton-based two-terminal volatile memristive devices are disclosed. The technologies described in the present disclosure may provide the following technical advantages.

First, the disclosed technology provides a novel proton-based two-terminal volatile memristive device including proton-based two-terminal volatile memristor devices and proton-based two-terminal volatile memcapacitor devices. The novel proton-based two-terminal volatile memristive device is based on proton migration mechanism where proton moves (or drifting) in and out of an oxide layer driven by an electric field. The proton migration mechanism may provide the device to include a fast switch mode and a slow switch mode depending on the switching speed of the input signal or trigger, the thickness of layers, and materials selections.

In the exemplary proton-based two-terminal volatile memristor device, it provides a more flexible circuit design to utilize two switch modes according to different user demands and applications which is highly desirable. To be more specific, the two-terminal volatile memristor device may, under fast switch mode, work as a selector to reduce the sneak current and half-select issues in a one-selector-one-memristor (1S1R) crossbar array circuit.

Furthermore, the two-terminal volatile memristor devices may, under slow switch mode, works as artificial synapses in neural network accelerators. Such an artificial synapse may more faithfully emulate biological synapses, resulting in spike rate dependent plasticity and spike timing dependent plasticity.

Besides, with the proton migration mechanism, the disclosed technology has very large diffusivity and low activation energy which means fast switching speed and low switching energy. Unlike conventional filamentary selectors, the proton may uniformly change the conductance of the oxide layer without forming random conduction filaments which significantly reducing the variability of the device and increasing the lifetime of the device.

Second, in the exemplary proton-based two-terminal volatile memcapacitor device, it may work as an artificial neuron (e.g., a memcapacitor neuron) in neural network accelerators.

Third, both the two-terminal volatile memristor devices and the proton-based two-terminal volatile memcapacitor devices in the present disclosure provide several possible structural designs for users to implement in crossbar array circuits according to different applications.

The implementations disclosed herein are illustrated by way of example, and not by way of limitation, in the figures of the accompanying drawings. Like reference numerals refer to corresponding parts throughout the drawings.

FIG. 1A is a block diagram 1000 illustrating an example crossbar array circuit 110 in accordance with some implementations of the present disclosure. As shown in FIG. 1A, the crossbar array circuit 110 includes a first row wire 101, a first column wire 102, and a cross-point device 103.

FIG. 1B shows a block diagram 1500 illustrating a partially enlarged view of an example cross-point device 103 in accordance with some implementations. As shown in FIG. 1B, the cross-point device 103 is connected to both the first row wire 101 and the first column wire 102. In some implementations, the cross-point device 103 includes a two-terminal volatile memristive device 1031, which may be is a proton-based two-terminal volatile memristive device. A two-terminal volatile memristive device is a proton-based device means that the conductance, capacitance, or both, of the two-terminal volatile memristive device changes or switches, as a result of one or more protons moving or diffusing in and out of an oxide layer, as the protons are driven by an electric field within the two-terminal volatile memristive device. A proton may include $H^+$ ions.

The proton-based two-terminal volatile memristive device 1031 may include a proton-based two-terminal volatile memristor device or a proton-based two-terminal volatile memcapacitor devices. Each implementation may provide different functions, deal with different issues, or execute different applications.

1. Sneak Current and Half-Selected Issues in Memristor Devices

Sneak currents that exist in crossbar array circuits implemented with memristor devices reduce computing accuracy, as explained below with reference to FIG. 2.

Figure 2:
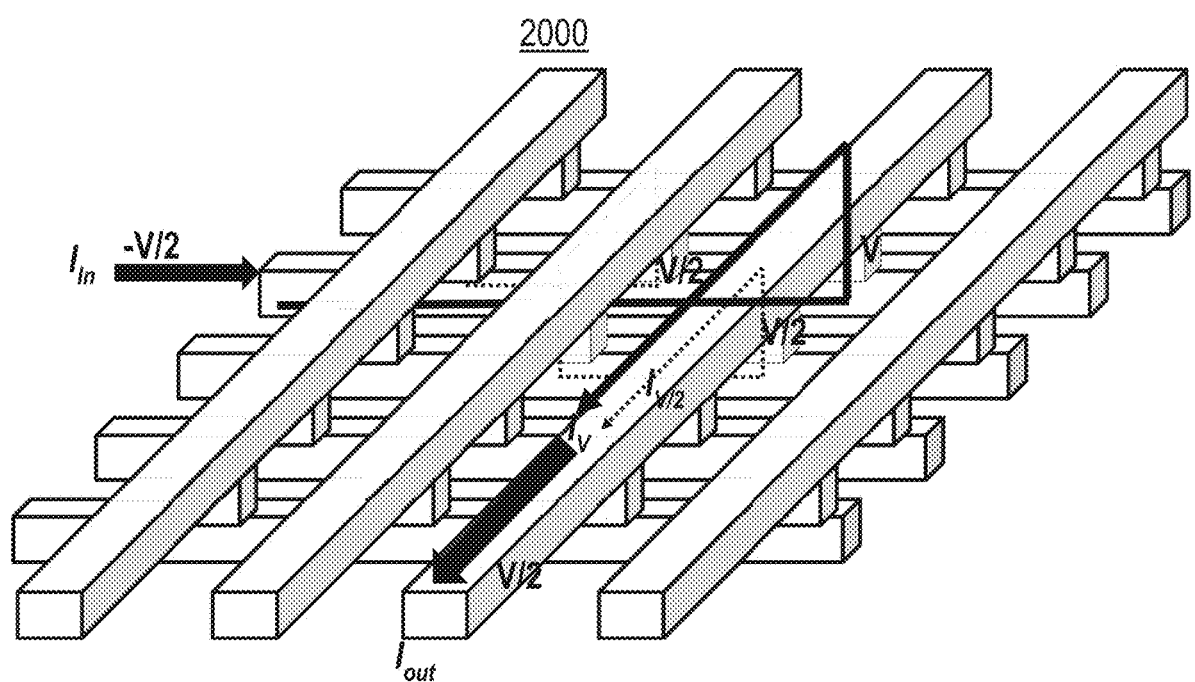
FIG. 2 is a block diagram illustrating a memristor crossbar array circuit without selectors.

FIG. 2 is a block diagram 2000 illustrating a memristor crossbar array circuit without selectors. As shown in FIG. 2, an example electrical addressing scheme for either a reading or writing operation on a target device is (1) to apply a V/2 voltage to one electrode of the target device and (2) to apply a −V/2 to the other electrode of the target device, resulting in a total voltage drop of V across the target device.

Such operations, however, may unintendedly result in a voltage drop of V/2 on the memristors that share a common row or column electrode with the target device. These memristors are sometimes referred to as half-selected devices: these devices suffer unwanted resistance change as a result of the unintended application of the voltage V/2.

Moreover, in addition to the intended current flowing through a selected memristor (e.g., IV), sneak path currents may flow through the half-selected memristors and some unselected memristors in the crossbar array. One such current path IV/2 is shown in FIG. 2.

The practical size of a crossbar array circuit is limited by the existence of sneak path current, because sneak path current can saturate the driving circuitry and generate unwanted Joule heating during writing/erasing operations. Further, sneak path currents limit reading operations, which require signals having current level that is higher than the background current level. The ON state is especially relevant, in which devices have relatively lower resistances; sneak path currents may thus be rampant during an ON state. The relatively lower resistance means reading operations are more susceptible to sneak path currents.

Example two-terminal thin-film-based selectors may include Schottky diodes, tunneling junctions, Ovonic Threshold Switches (OTS), and Metal-Insulator Transitions (MIT). These selectors, however, usually suffer from high switching energy and large variability issues.

Technologies relating proton-based two-terminal volatile memristive devices described in the present disclosure may solve these technical challenges by enabling both a fast switch mode and a slow switch mode on a two-terminal volatile memristive device.

A two-terminal volatile memristor device may, under the fast switch mode, work as a selector to reduce sneak current and half-select issues in a 1S1R crossbar array circuit, while maintaining uniformity and without requiring high switching energy. Example two-terminal volatile memristor devices as illustrated in FIGS. 5A-5D.

2. Artificial Synapses in Neural Network Accelerators

The slow switch mode (e.g., delay dynamics of ON switching) may be implemented to provide artificial neurons with leaky integration and fire properties.

Figure 3:
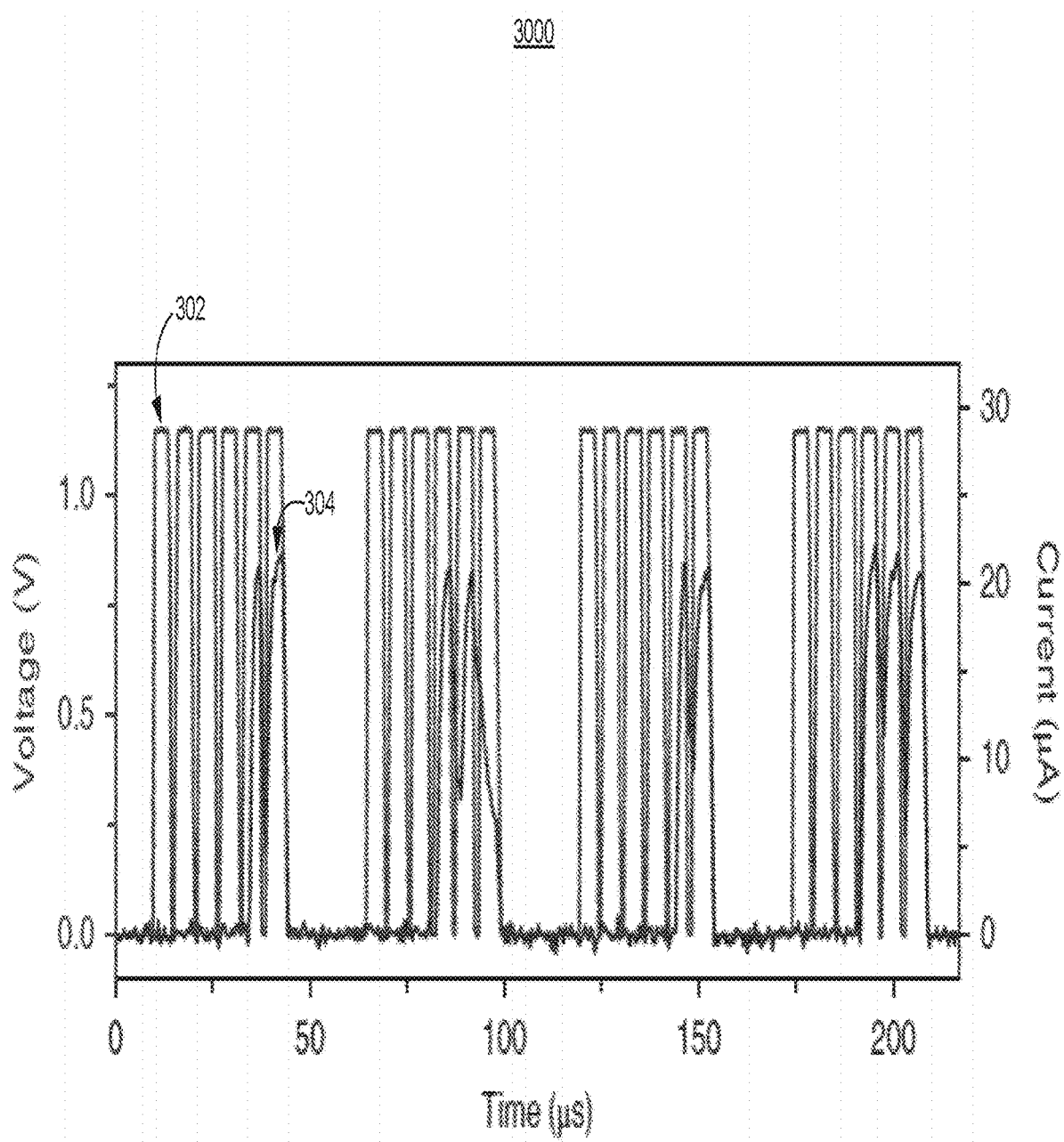
FIG. 3 is a voltage measurement chart illustrating example leaky integration and fire functions of an artificial neuron.

FIG. 3 is a voltage measurement chart illustrating example leaky integration and fire functions of an artificial neuron. As shown in FIG. 3, the delay dynamics of ON switching may perform neuron's function. The rectangular pulses (the pulse 302, for example) represent clock input signals; the spikes (the spike 304, for example) represent neuron potential (or membrane potential), which are triggered after several input signals making it become the threshold.

Diffusion dynamics of the relaxation process from the ON state to the OFF state may be implemented to provide more faithful synapses. To optimize to a higher precision simulation of a biological synapse, a drift memristor may be connected in series to a diffusive memristor.

Figure 4A:
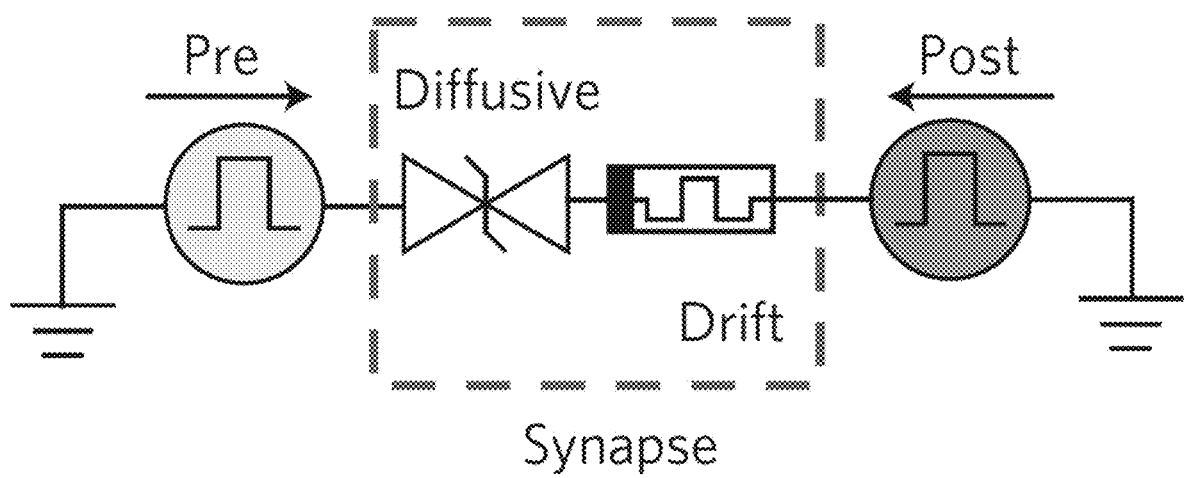
FIG. 4A is a block diagram illustrating a schematic synapse represented by a drift memristor in series of a diffusive memristor.
Figure 4B:
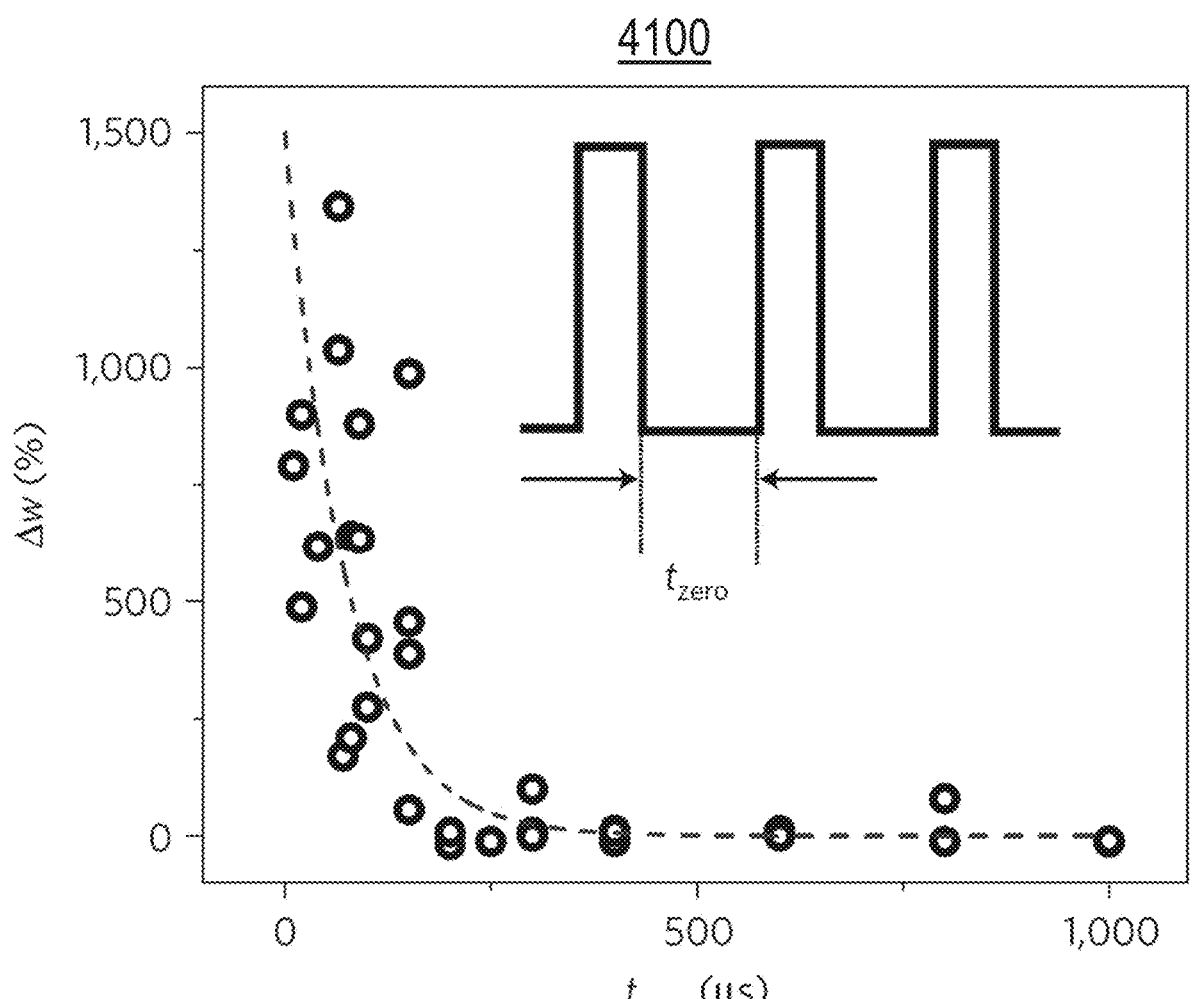
FIGS. 4B-4C are block diagrams illustrating example characteristics of a synapse.
Figure 4C:
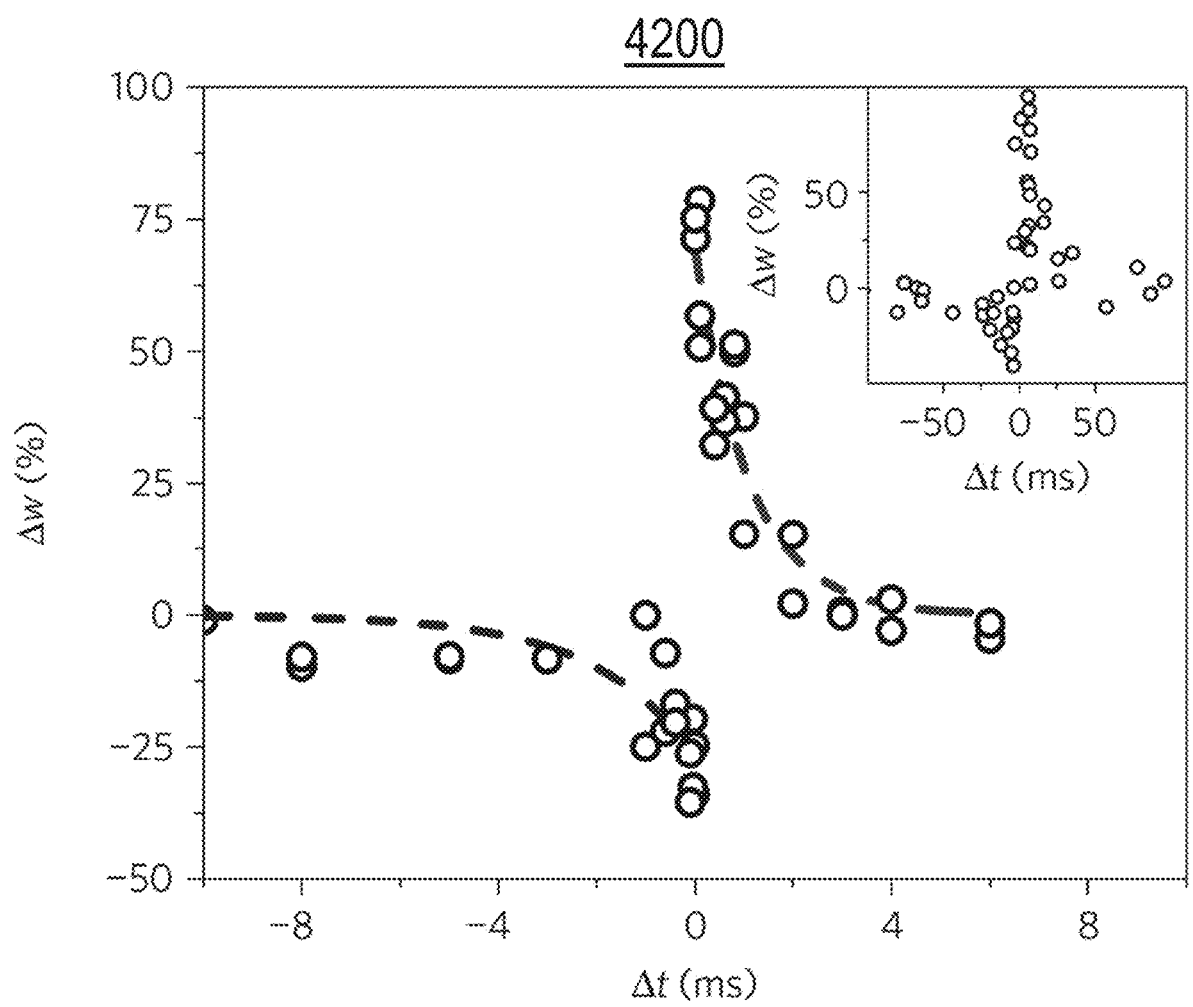

FIG. 4A is a block diagram 4000 illustrating a schematic synapse represented by a drift memristor in series of a diffusive memristor. FIGS. 4B-4C are block diagrams illustrating example characteristics of a synapse.

As shown in FIG. 4A, the two-terminal diffusive memristor may be used in series of a drift memristor to provide the diffusive dynamic needed in a synapse (e.g., the nonvolatile memory of the synapse is represented by the nonvolatile drift memristor). Such combined artificial synapse may more faithfully simulate biological synapses, resulting in spike rate dependent plasticity and spike timing dependent plasticity, as shown in FIGS. 4B and 4C, respectively.

Figure 5A:
FIG. 5A is a block diagram illustrating a first example proton-based two-terminal volatile memristor device in accordance with some implementations of the present disclosure.

FIG. 5A is a block diagram 5000 illustrating a proton-based two-terminal volatile memristor device 500 in accordance with some implementations of the present disclosure. As shown in FIG. 5A, the proton-based two-terminal volatile memristor device 500 includes a first bottom conductive layer 501, a first switching oxide layer 503 formed on the first bottom conductive layer 501, a first top conductive layer 505 formed on the first switching oxide layer 503, an intermediate layer 521 formed on the first top conductive layer 505, a second bottom conductive layer 511 formed on the intermediate layer 521, a second oxide layer 513 whose conductance can be modulated by H-dopant formed on the second bottom conductive layer 511, and a proton reservoir layer 515 formed on the second oxide layer 513.

In some implementations, the second bottom conductive layer 511, the second oxide layer 513, and the proton reservoir layer 515 are H-doped. The protons may include $H^+$ ions.

In some implementations, the first bottom conductive layer 501, the first switching oxide layer 503, and the first top conductive layer 505 may be formed to function as a drift memristor as explained above; the second bottom conductive layer 511, the second oxide layer 513, and the proton reservoir layer 515 may be formed to function as a diffusive memristor.

In some implementations, the first bottom conductive layer 501 is made of one or more materials that are selected from Pd, Pt, Ir, W, Ta, Hf, Nb, V, Ti, TiN, TaN, NbN, a combination thereof, and an alloy of any of these materials with another conductive material.

In some implementations, the first switching oxide layer 503 is made of one or more materials that are selected from $TaO_x$ (where $x \leq 2.5$), $HfO_x$ (where $x \leq 2$), $TiO_x$ (where $x \leq 2$), or a combination thereof.

In some implementations, the first top conductive layer 505 is made of one or more materials that are selected from Pd, Pt, Ir, W, Ta, Hf, Nb, V, Ti, TiN, TaN, NbN, a combination thereof, and an alloy of any of these materials with another conductive material.

In some implementations, the intermediate layer 521 is made of one or more such metals as W, Al, Cu, Pt, Ir, Ru, Pd, or Au, one or more such metal compounds as TiN, TaN, WN, $RuO_2$, or $IrO_2$, a combination thereof, and an alloy of any of these materials with another conductive material.

In some implementations, the second bottom conductive layer 511 is made of one or more materials that are selected from TiN, Pt, TaN, Al, Ni, a combination thereof, and an alloy of any of these materials with another conductive material.

In some implementations, the second oxide layer 513 513 whose conductance can be modulated by H-dopant is made of one or more materials that are selected from $WO_3$, $TiO_2$, $VO_2$, $Nb_2O_5$, $Ta_2O_5$, and $HfO_2$.

In some implementations, the proton reservoir layer 515 is made of one or more materials such as Pt, Pd, $Cr_2O_3$, $PdH_4$, or a combination thereof.

In the implementations where the second bottom conductive layer 511, the second oxide layer 513, and the proton reservoir layer 515 may be $Cr_2O_{3-}$, $WO_{3-}$, and TiN/H– doped, respectively, the $WO_3$ layer has no $H^+$ ions when the device is powered off and the $WO_3$ layer is in a high resistance state.

When the device is powered on, however, the $H^+$ ions diffuse to the $WO_3$ layer, rendering the $WO_3$ layer conductive. Once the power is removed, the $WO_3$ layer reverts back to the high resistance state. The diffused protons can uniformly change the conductance of the $WO_3$ layer without forming random conduction filament(s), significantly reducing the variability of the device and increasing the lifetime of the device. This shows how diffusion dynamics works by using the proton diffusing mechanism.

Figure 5B:
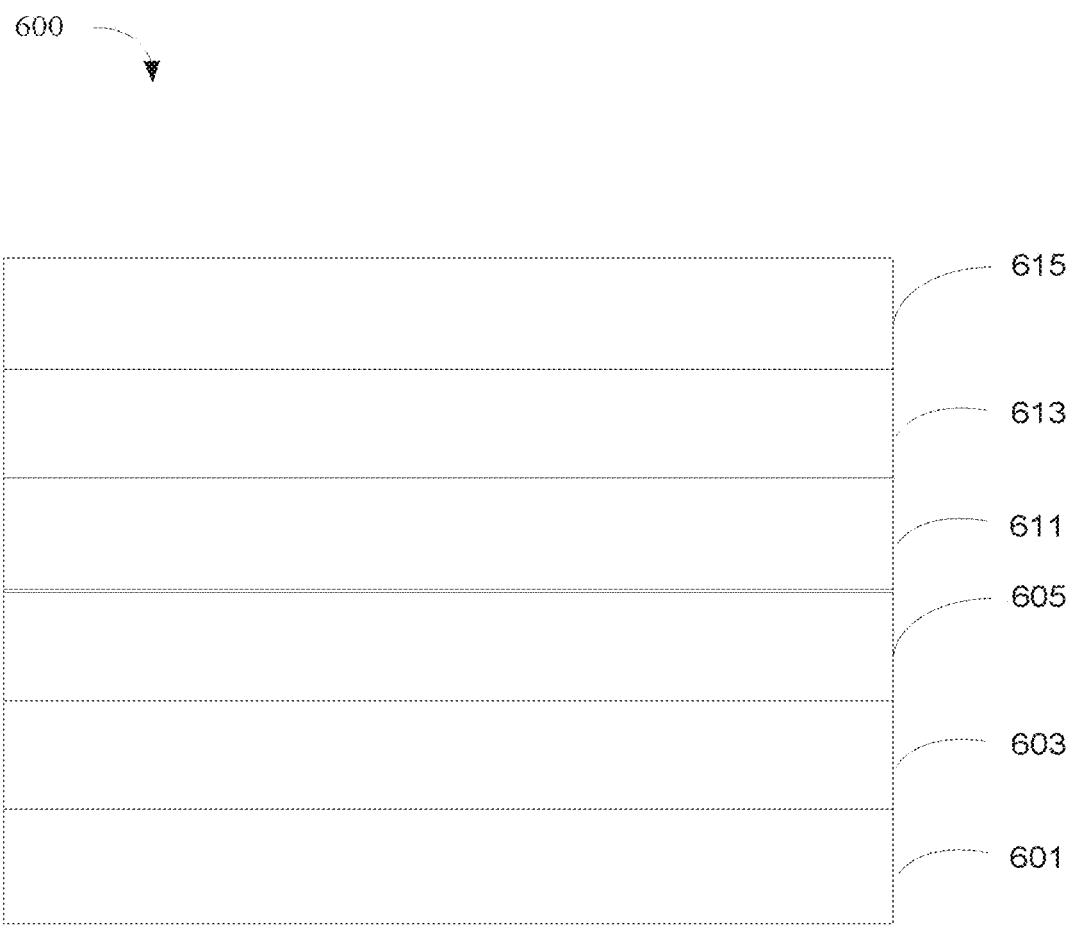
FIG. 5B is a block diagram illustrating a second example proton-based two-terminal volatile memristor device in accordance with some implementations of the present disclosure.

FIG. 5B is a block diagram 6000 illustrating a proton-based two-terminal volatile memristor device 600 in accordance with some implementations of the present disclosure. As shown in FIG. 5B, the proton-based two-terminal volatile memristor device 600 includes a first bottom conductive layer 601, a first switching oxide layer 603 formed on the first bottom conductive layer 601, a first top conductive layer 605 formed on the first switching oxide layer 603, a second bottom conductive layer 611 formed on the first top conductive layer 605, a second oxide layer 613 formed on the second bottom conductive layer 611, and a proton reservoir layer 615 formed on the second oxide layer 613.

In contrast with the implementations shown FIG. 5A, in the implementations shown in FIG. 5B, no intermediate layer is formed between the first top conductive layer 605 and the second bottom conductive layer 611. Therefore, the manufacturing process may be simplified, and the size of the device may be reduced.

Figure 5C:
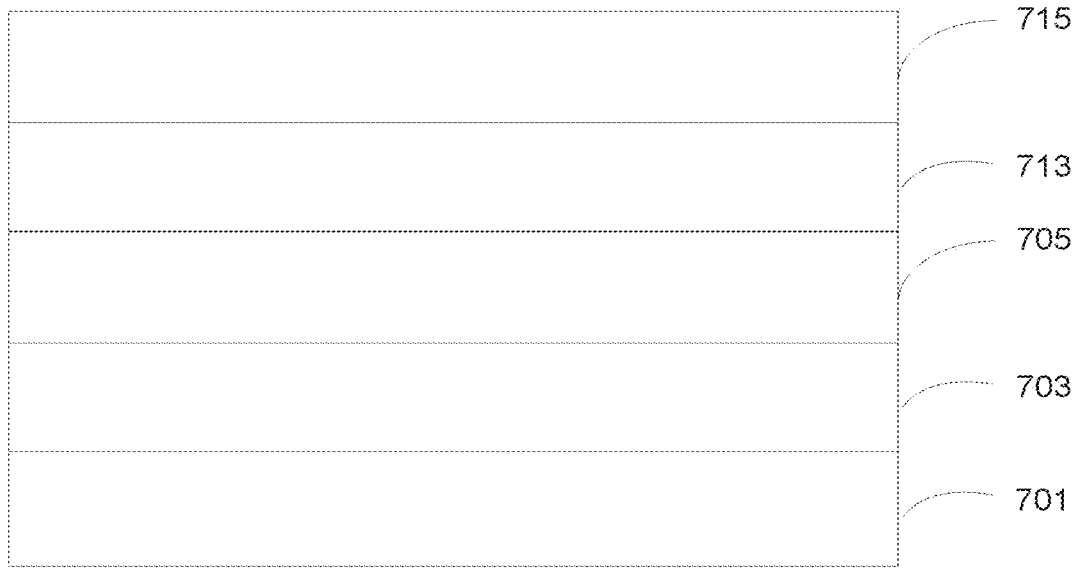
FIG. 5C is a block diagram illustrating a third example proton-based two-terminal volatile memristor device in accordance with some implementations of the present disclosure.

FIG. 5C is a block diagram 7000 illustrating a proton-based two-terminal volatile memristor device 700 in accordance with some implementations of the present disclosure. As shown in FIG. 5C, the proton-based two-terminal volatile memristor device 700 includes a first bottom conductive layer 701, a first switching oxide layer 703 formed on the first bottom conductive layer 701, a first top conductive layer 705 formed on the first switching oxide layer 703, a second M oxide layer 713 formed on the first top conductive layer 705, and a proton reservoir layer 715 formed on the second oxide layer 713.

In contrast with the implementations shown FIG. 5B, in the implementations shown in FIG. 5C, the second bottom conductive layer 611 is removed. Therefore, the manufacturing process may be further simplified, and the size of the device may be further reduced.

Figure 5D:
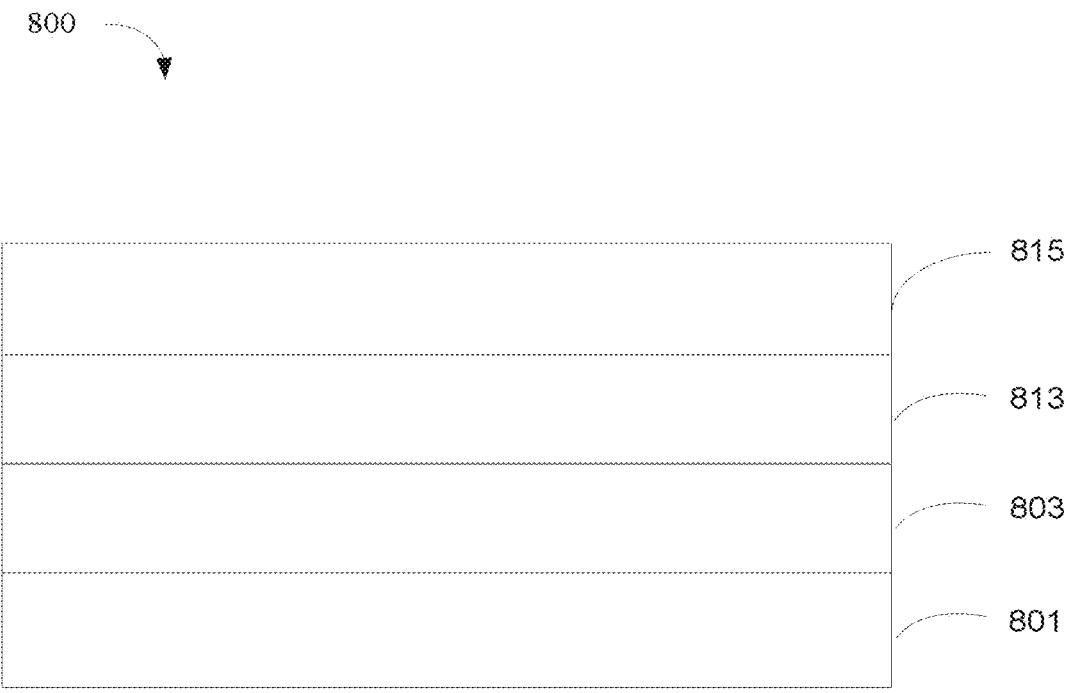
FIG. 5D is a block diagram illustrating a fourth example proton-based two-terminal volatile memristor device in accordance with some implementations of the present disclosure.

FIG. 5D is a block diagram 8000 illustrating a proton-based two-terminal volatile memristor device 800 in accordance with some implementations of the present disclosure. As shown in FIG. 5D, the proton-based two-terminal volatile memristor device 800 includes a first bottom conductive layer 801, a first switching oxide layer 803 formed on the first bottom conductive layer 801, a second oxide layer 813 formed on the first switching oxide layer 803, and a proton reservoir layer 815 formed on the second oxide layer 813, whose conductance can be modulated by H-dopant.

In contrast with the implementations shown FIG. 5C, in the implementations shown in FIG. 5D, the first top conductive layer 705 is removed. Therefore, the manufacturing process may be simplified even more, and the size of the device may be reduced even more. Layers shown in FIGS. 5B-5D may be made of the same materials as explained with reference to FIG. 5A.

3. Memcapacitor Neuron in Neural Network Accelerators

In some implementations, the proton-based two-terminal volatile memristive device 1031 includes a proton-based two-terminal volatile memcapacitor device.

Figure 6A:
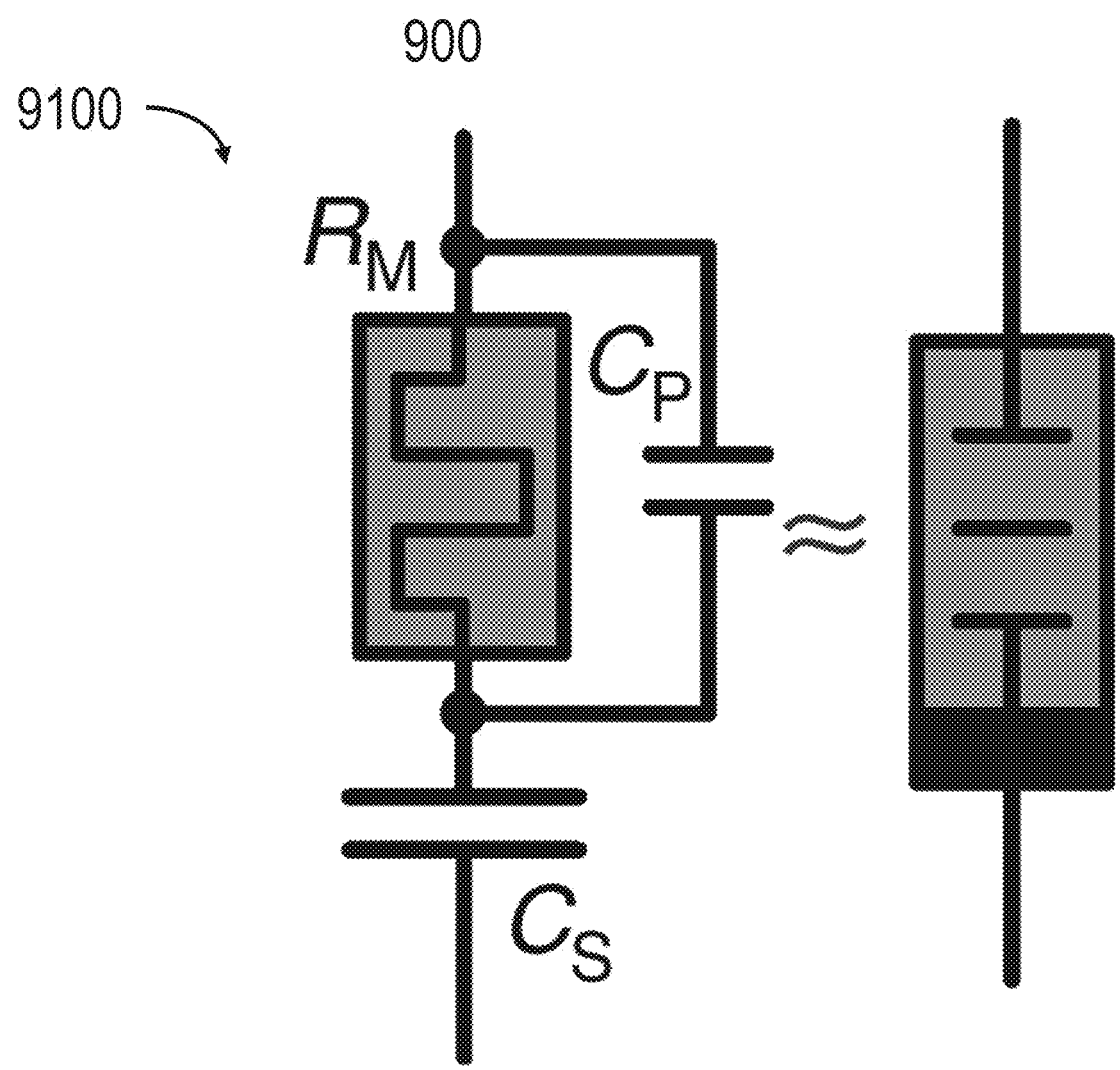
FIG. 6A is a block diagram illustrating an example volatile memcapacitor in accordance with some implementations of the present disclosure.

FIG. 6A is a block diagram 9100 illustrating an example circuit 900 of a volatile memcapacitor. The capacity of the parallel capacitance Cp is far lower than that of the series capacitance Cs, when connected to a memristor. After being powered on, the circuit 900 functions as a memcapacitor. The memcapacitor may change its capacitance according to the ON/OFF state, generate a neuron's function or function as a memory capacitance.

Figure 6B:
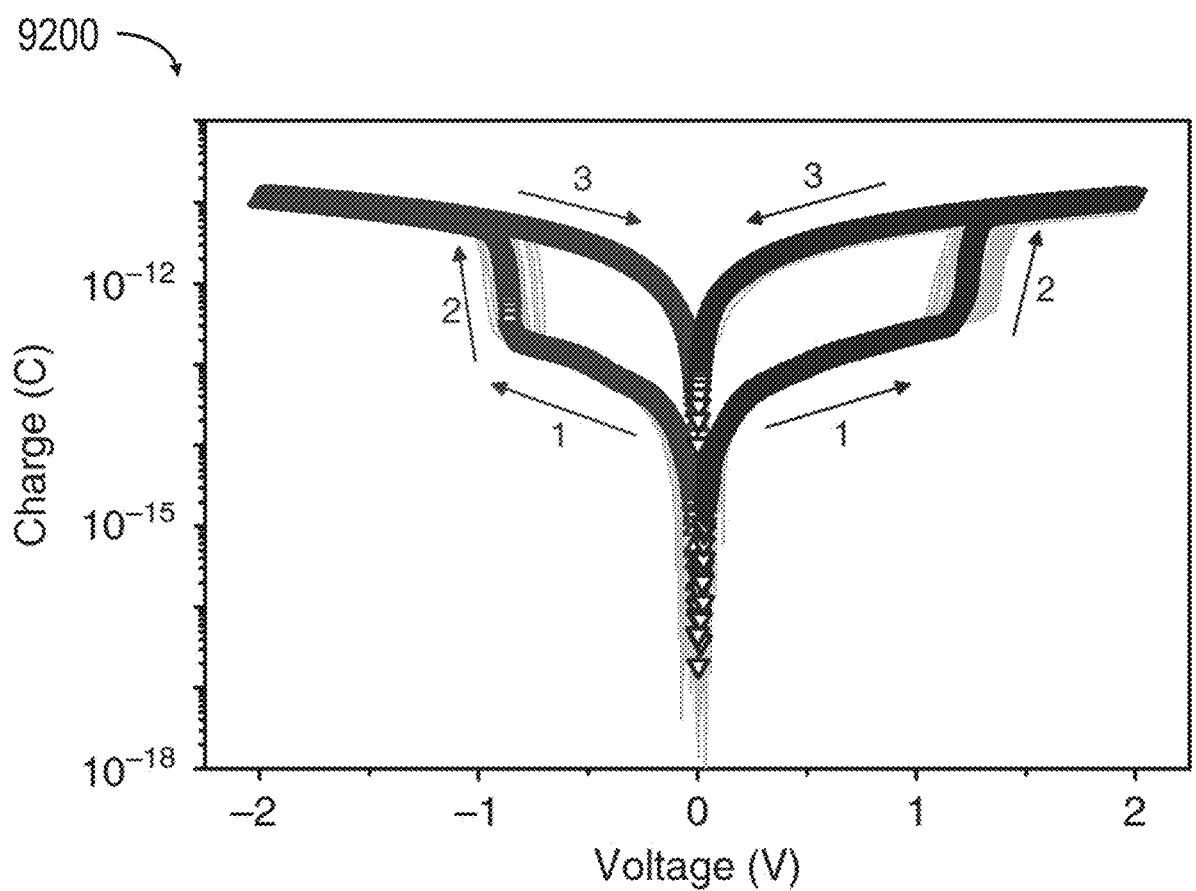
FIG. 6B is an IV curve chart illustrating example DC switching loops of a volatile memcapacitor in accordance with some implementations of the present disclosure.

FIG. 6B shows an IV curve chart 9200 illustrating DC switching loops of an example volatile memcapacitor.

Figure 6C:
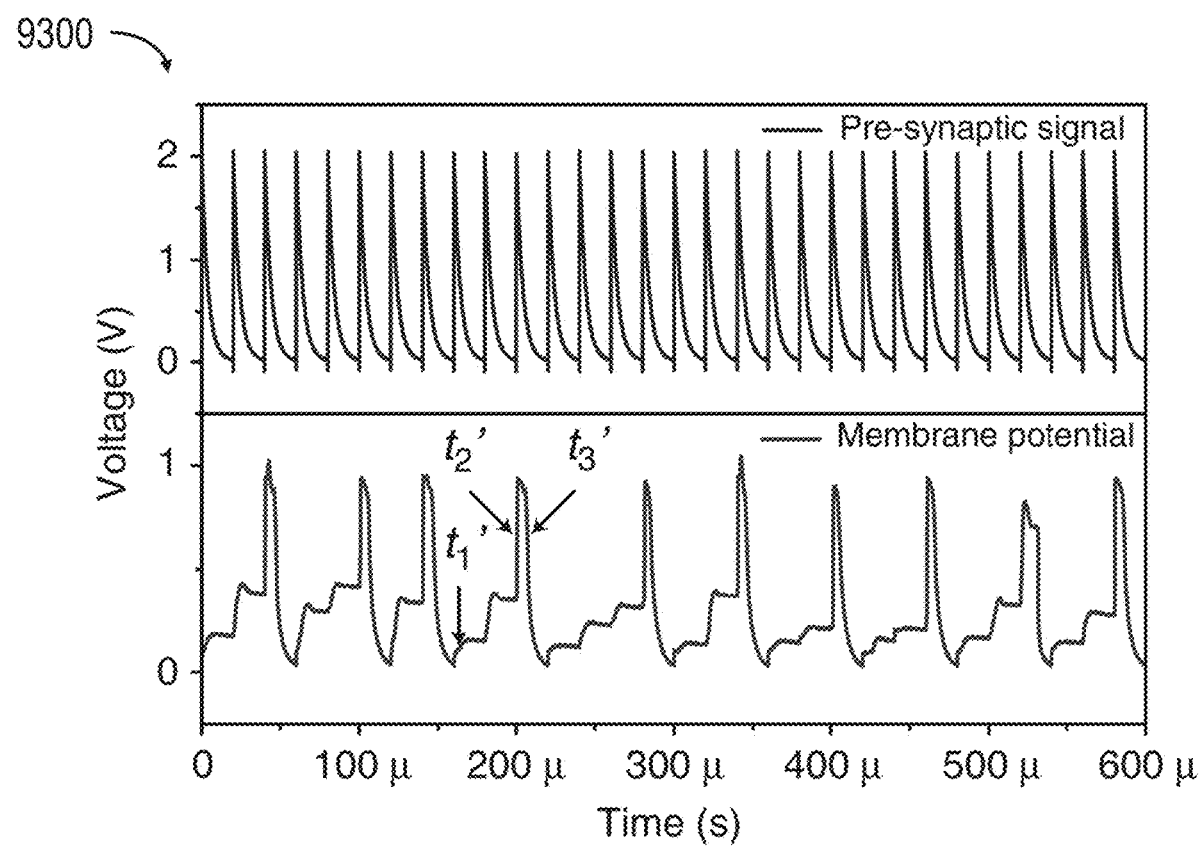
FIG. 6C is an electrical pulsing measurement chart illustrating example integration and fire demonstration of volatile memcapacitor neurons.

FIG. 6C shows an electrical pulsing measurement chart 9300 illustrating integration and fire demonstration functionalities of volatile memcapacitor neurons. These characteristics described in FIG. 6C show that a proton-based two-terminal volatile memcapacitor may be implemented in neural networks to simulate the behaviors of memcapacitor neurons.

Figure 7A:
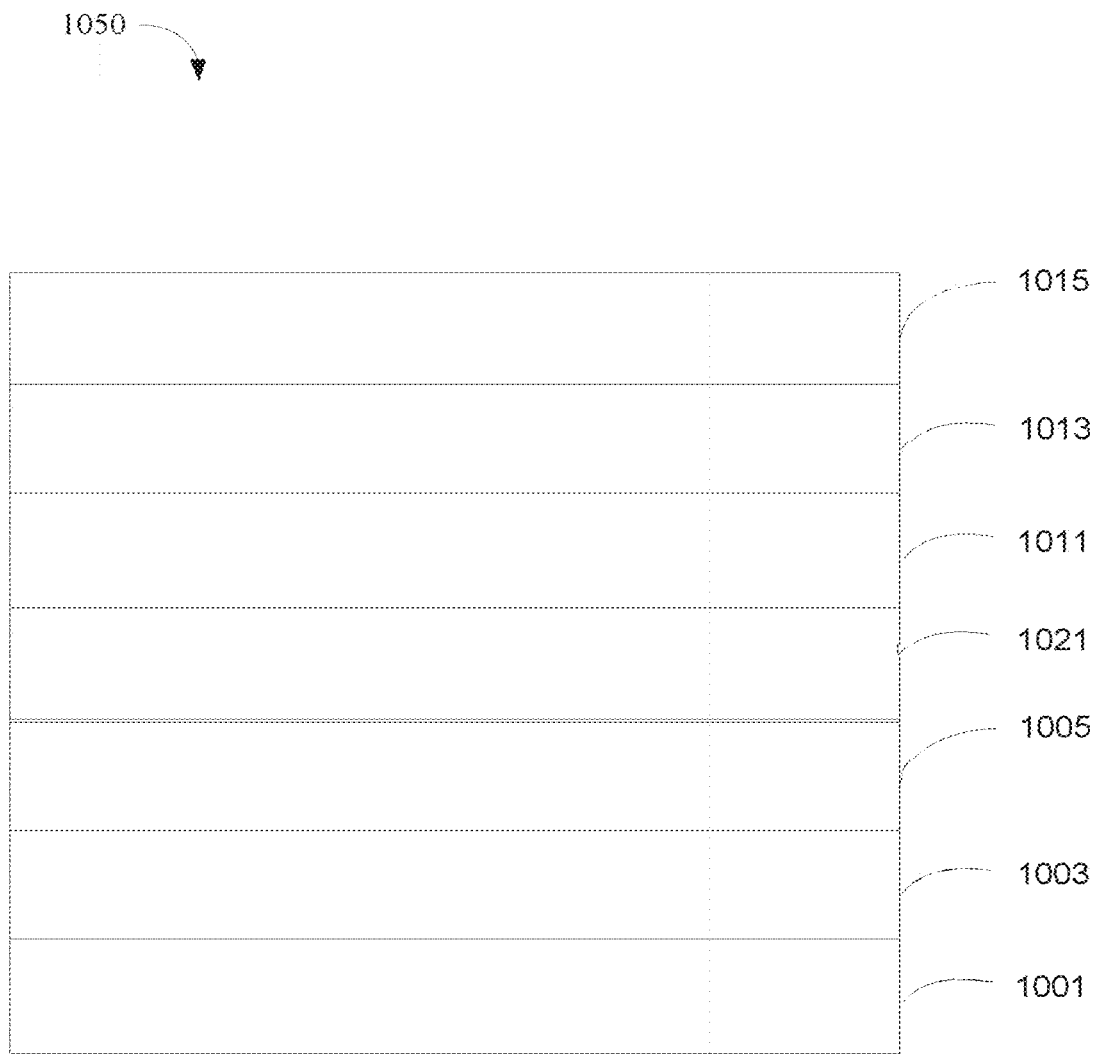
FIG. 7A is a block diagram illustrating a first example proton-based two-terminal volatile memcapacitor device in accordance with some implementations of the present disclosure.

FIG. 7A is a block diagram 10000 illustrating a proton-based two-terminal volatile memcapacitor device 1050 in accordance with some implementations of the present disclosure. As shown in FIG. 7A, the proton-based two-terminal volatile memcapacitor device 1050 includes a first bottom conductive layer 1001, a first capacitor oxide layer 1003 formed on the first bottom conductive layer 1001, a first top conductive layer 1005 formed on the first capacitor oxide layer 1003, an intermediate layer 1021 formed on the first top conductive layer 1005, a second bottom conductive layer 1011 formed on the intermediate layer 1021, a second oxide layer 1013 whose conductance can be modulated by H-dopant formed on the second bottom conductive layer 1011, and a proton reservoir layer 1015 formed on the second oxide layer 1013.

In some implementations, the second bottom conductive layer 1011, the second oxide layer 1013, and the proton reservoir layer 1015 are H-doped. The protons may include $H^+$ ions.

In some implementations, the first bottom conductive layer 1001, the first capacitor oxide layer 1003, and the first top conductive layer 1005 may be formed to function as a high-K capacitor, whereas the second bottom conductive layer 1011, the second oxide layer 1013, and the proton reservoir layer 1015 may be formed to function as a diffusive memristor.

In some implementations, the first bottom conductive layer 1001 is made of one or more materials that are selected from Pd, Pt, Ir, W, Ta, Hf, Nb, V, Ti, TiN, TaN, NbN, a combination thereof, and an alloy of any of these materials with another conductive material.

In some implementations, the first capacitor oxide layer 1003 is made of one or more materials that are selected from $TaO_2$, $HfO_2$, $TiO_2$, or a combination thereof. In some implementations, the dielectric constant of the first capacitor oxide layer 1003 is no less than 10. In some other implementations, to increase the efficiency of the high-K capacitor, the dielectric constant of the first capacitor oxide layer 1003 is no less than 10 or 20 in other cases.

In some implementations, the first top conductive layer 1005 is made of one or more materials that are selected from Pd, Pt, Ir, W, Ta, Hf, Nb, V, Ti, TiN, TaN, NbN, a combination thereof, and an alloy of any of these materials with another conductive material.

In some implementations, the intermediate layer 1021 is made of one or more such metals as W, Al, Cu, Pt, Ir, Ru, Pd, or Au, one or more such metal compounds as TiN, TaN, WN, $RuO_2$, or $IrO_2$, a combination thereof, and an alloy of any of these materials with another conductive material.

In some implementations, the second bottom conductive layer 1011 is made of one or more materials that are selected from TiN, Pt, TaN, Al, Ni, a combination thereof, and an alloy of any of these materials with another conductive material.

In some implementations, the second oxide layer 1013 whose conductance can be modulated by H-dopant is made of one or more materials such as $WO_3$, $TiO_2$, $VO_2$, $Nb_2O_5$, $Ta_2O_5$, or $HfO_2$.

In some implementations, the proton reservoir layer 1015 is made of one or more materials that are selected from $Cr_2O_3$, $PdH_4$, or a combination thereof.

In the implementations where the second bottom conductive layer 1011, the second oxide layer 1013, and the proton reservoir layer 1015 includes such materials as $Cr_2CO_{3-}$, $WO_{3-}$, and TiN/H-doped, respectively, the WO3 layer has little to no $H^+$ ions when the device is powered off and the WO3 layer is in the high resistance state.

When the device is powered on, however, the H⁺ ions diffuse to the $WO_3$ layer, rendering the $WO_3$ layer conductive. Once the power is removed, the $WO_3$ layer reverts back to the high resistance state. The diffused protons can uniformly change the conductance of the WO3 layer without forming random conduction filament(s), significantly reducing the variability of the device and increasing the lifetime of the device. This shows how diffusion dynamics works by using the proton diffusing mechanism.

Figure 7B:
FIG. 7B is a block diagram illustrating a second example proton-based two-terminal volatile memcapacitor device in accordance with some implementations of the present disclosure.

FIG. 7B is a block diagram 11000 illustrating a proton-based two-terminal volatile memcapacitor device 1150 in accordance with some implementations of the present disclosure. As shown in FIG. 7B, the proton-based two-terminal volatile memcapacitor device 1150 includes a first bottom conductive layer 1101, a first capacitor oxide layer 1103 formed on the first bottom conductive layer 1101, a first top conductive layer 1105 formed on the first capacitor oxide layer 1103, a second bottom conductive layer 1111 formed on the first top conductive layer 1105, a second oxide layer 1113 formed on the second bottom conductive layer 1111, and a proton reservoir layer 1115 formed on the second oxide layer 1113.

In contrast with the implementations shown FIG. 7A, in the implementations shown in FIG. 7B, no intermediate layer is formed between the first top conductive layer 1105 and the second bottom conductive layer 1111. Therefore, the manufacturing process may be simplified; the size of the device may be reduced.

Figure 7C:
FIG. 7C is a block diagram illustrating a third example proton-based two-terminal volatile memcapacitor device in accordance with some implementations of the present disclosure.

FIG. 7C is a block diagram 12000 illustrating a proton-based two-terminal volatile memcapacitor device 1250 in accordance with some implementations of the present disclosure. As shown in FIG. 7C, the proton-based two-terminal volatile memcapacitor device 1250 includes a first bottom conductive layer 1201, a first capacitor oxide layer 1203 formed on the first bottom conductive layer 1201, a first top conductive layer 1205 formed on the first capacitor oxide layer 1203, a second oxide layer 1213 formed on the first top conductive layer 1205, and a proton reservoir layer 1215 formed on the second oxide layer 1213.

In contrast with the implementations shown FIG. 7B, in the implementations shown in FIG. 7C, the second bottom conductive layer 1111 is removed. Therefore, the manufacturing process may be further simplified; the size of the device may be further reduced.

Figure 7D:
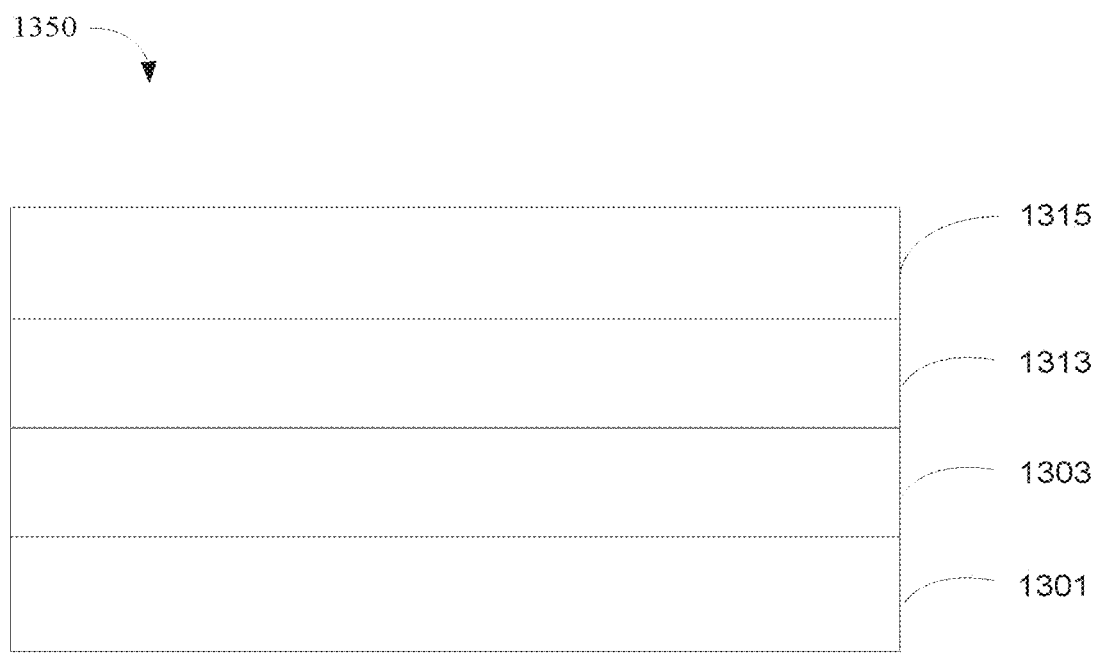
FIG. 7D is a block diagram illustrating a fourth example proton-based two-terminal volatile memcapacitor device in accordance with some implementations of the present disclosure.

FIG. 7D is a block diagram 13000 illustrating a proton-based two-terminal volatile memcapacitor device 1350 in accordance with some implementations of the present disclosure. As shown in FIG. 7D, the proton-based two-terminal volatile memcapacitor device 1350 includes a first bottom conductive layer 1301, a first capacitor oxide layer 1303 formed on the first bottom conductive layer 1301, a second oxide layer 1313 formed on the first capacitor oxide layer 1303, and a proton reservoir layer 1315 formed on the second oxide layer 1313.

In contrast with the implementations shown FIG. 7C, in the implementations shown in FIG. 7D, the first top conductive layer 1305 is removed. Therefore, the manufacturing process may be simplified even more; the size of the device may be reduced even more.

Layers shown in FIGS. 7B-7D may be made of the same materials as explained with reference to FIG. 7A.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both columns, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus, comprising:
a first bottom conductive layer;
a capacitor oxide layer formed on the first bottom conductive layer;
a second bottom conductive layer formed on the capacitor oxide layer, wherein the second bottom conductive layer is H-doped;
a second oxide layer formed on the second bottom conductive layer, wherein a conductance of the second oxide layer is modulated by H-dopant; and
a proton reservoir layer formed on the second oxide layer.

2. The apparatus of claim 1, wherein the first bottom conductive layer comprises at least one of Pd, Pt, Ir, W, Ta, Hf, Nb, V, Ti, TiN, TaN, or NbN.

3. The apparatus of claim 1, wherein the first bottom conductive layer comprises an alloy comprising at least one of Pd, Pt, Ir, W, Ta, Hf, Nb, V, Ti, TiN, TaN, or NbN.

4. The apparatus of claim 1, wherein the capacitor oxide layer comprises at least one of $TaO_2$, $HfO_2$, or $TiO_2$.

5. The apparatus of claim 1, wherein the second bottom conductive layer comprises at least one of TiN, Pt, TaN, Al, or Ni.

6. The apparatus of claim 1, wherein the second bottom conductive layer comprises an alloy comprising at least one of TiN, Pt, TaN, Al, or Ni.

7. The apparatus of claim 1, wherein the second oxide layer comprises at least one of $WO_3$, $TiO_2$, $VO_2$, $Nb_2O_5$, $Ta_2O_5$, or $HfO_2$.

8. The apparatus of claim 1, wherein the proton reservoir layer comprises at least one of $Cr_2O_3$ or $PdH_4$.

9. The apparatus of claim 1, wherein a dielectric constant of the capacitor oxide layer is not less than 10.

10. The apparatus of claim 1, further comprising:
a first top conductive layer formed between the capacitor oxide layer and the second bottom conductive layer.

11. The apparatus of claim 10, wherein the first top conductive layer comprises at least one of Pd, Pt, Ir, W, Ta, Hf, Nb, V, Ti, TiN, TaN, or NbN.

12. The apparatus of claim 10, wherein the first top conductive layer comprises an alloy comprising at least one of Pd, Pt, Ir, W, Ta, Hf, Nb, V, Ti, TiN, TaN, or NbN.

13. The apparatus of claim 10, further comprising:
an intermediate layer formed between the first top conductive layer and the second bottom conductive layer.

14. The apparatus of claim 13, wherein the intermediate layer comprises at least one of W, Al, Cu, Pt, Ir, Ru, Pd, Au, TiN, TaN, WN, $RuO_2$, or $IrO_2$.

15. The apparatus of claim 13, wherein the intermediate layer comprises an alloy comprising at least one of W, Al, Cu, Pt, Ir, Ru, Pd, Au, TiN, TaN, WN, $RuO_2$, or $IrO_2$.

* * * * *